(12) United States Patent
Lim et al.

(10) Patent No.: US 6,683,010 B1
(45) Date of Patent: Jan. 27, 2004

(54) METHOD FOR FORMING SILICON-OXYNITRIDE LAYER ON SEMICONDUCTOR DEVICE

(75) Inventors: Baek-gyun Lim, Kyungki-do (KR); Eu-seok Kim, Seoul (KR); Chang-jip Yang, Kyungki-do (KR); Young-kyou Park, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/104,864

(22) Filed: Jun. 25, 1998

(30) Foreign Application Priority Data

Jun. 27, 1997 (KR) .............................. 97-28144

(51) Int. Cl.[7] .............................................. H01L 21/31
(52) U.S. Cl. ................. 438/785; 438/216; 438/240; 438/261; 438/264; 438/591; 438/287
(58) Field of Search ......................... 438/264, 216, 438/287, 591, 785, 240, 261

(56) References Cited

U.S. PATENT DOCUMENTS

| | | | | |
|---|---|---|---|---|
| 5,244,843 A | * | 9/1993 | Chau | 437/239 |
| 5,296,411 A | * | 3/1994 | Gardner | 437/238 |
| 5,371,028 A | * | 12/1994 | Koh | 437/43 |
| 5,393,683 A | * | 2/1995 | Mathews | 437/42 |
| 5,726,087 A | * | 3/1998 | Tseng | 438/261 |
| 5,808,348 A | * | 9/1998 | Ito | 257/410 |
| 5,866,474 A | * | 2/1999 | Liu | 438/591 |
| 5,885,870 A | * | 3/1999 | Maiti | 438/261 |
| 5,918,125 A | * | 6/1999 | Guo | 438/264 |
| 5,960,302 A | * | 9/1999 | Ma | 438/585 |
| 5,969,397 A | * | 10/1999 | Grider, III | 257/410 |

FOREIGN PATENT DOCUMENTS

| | | | | |
|---|---|---|---|---|
| JP | 5-198574 | * | 6/1993 | 437/239 |

OTHER PUBLICATIONS

Wolf, Stanley, "Silicon Processing for the VLSI Era", vol. 1, p234, 1986.*

* cited by examiner

Primary Examiner—Evan Pert
Assistant Examiner—Lisa Kilday
(74) Attorney, Agent, or Firm—Marger Johnson & McCollom, P.C.

(57) ABSTRACT

A semiconductor device provides improved performance at high integration levels by utilizing a gate insulation layer formed from silicon-oxynitride which prevents impurities in the doped gate electrode from diffusing into the semiconductor substrate during the fabrication processes. A method for forming the silicon-oxynitride layer utilizes a vertical diffusion furnace to increase productivity and achieve a uniform nitrogen density in the silicon-oxynitride layer. The method includes forming an initial oxide layer on a semiconductor substrate, changing the initial oxide layer into a pure oxide layer, and then changing the pure oxide layer into a silicon-oxynitride layer. The initial oxide layer is formed by loading a semiconductor substrate into a diffusion furnace at a temperature between 550~750° C., raising the temperature of the substrate to between 700~950° C., and injecting a mixture of oxygen and nitrogen has into the diffusion furnace. The initial oxide layer is then changed into a pure oxide layer by utilizing either a wet or dry oxidation method. The pure oxide layer is then changed into a silicon-oxynitride layer by injecting $N_2O$ into the diffusion furnace. Finally, nitrogen gas is injected into the furnace to cool the substrate down slowly, thereby reduce stress in the substrate.

15 Claims, 3 Drawing Sheets

METHOD FOR FORMING SILICON-OXYNITRIDE LAYER ON SEMICONDUCTOR DEVICE

This application corresponds to Korean patent application No. 97-28144 filed Jun. 27, 1997, in the name of Samsung Electronics Co., Ltd., which is herein incorporated by reference for all purposes.

BACKGROUND OF THE INVENTION

1. Field of the Invention

This invention relates generally to semiconductor devices, and more particularly, to a method for forming a silicon-oxynitride layer suitable for use as a gate insulating layer on a semiconductor device.

2. Description of the Related Art

A layer of silicon oxide is generally used as gate insulation for semiconductor memory devices. However, as semiconductor devices become more highly integrated, the silicon oxide layer must be made thinner, and thus, the electric field strength in the gate insulation increases. Accordingly, the leakage current, breakdown voltage, and other characteristics of the silicon oxide layer must be improved to maintain adequate performance at a given operation voltage.

However, the characteristics of silicon oxide layers can not be improved sufficiently, and thus, silicon oxide is inappropriate for use as gate insulation in highly integrated semiconductor devices.

Accordingly, a need remains for an improved gate insulation layer for semiconductor devices.

SUMMARY OF THE INVENTION

Therefore, it is an object of the present invention to provide a gate insulation layer having improved characteristics.

Another object of the present invention is to provide a gate insulation layer for semiconductor device that can replace silicon oxide.

A further object of the present invention is to provide a method for forming an improved gate insulation layer on a semiconductor device.

To accomplish these and other objects, a semiconductor device constructed in accordance with the present invention provides improved performance at high integration levels by utilizing a gate insulation layer formed from silicon-oxynitride which prevents impurities in the doped gate electrode from diffusing into the semiconductor substrate during the fabrication processes.

A method for forming the silicon-oxynitride layer in accordance with the present invention utilizes a vertical diffusion furnace to increase productivity and achieve a uniform nitrogen density in the silicon-oxynitride layer. The method includes forming an initial oxide layer on a semiconductor substrate, changing the initial oxide layer into a pure oxide layer, and then changing the pure oxide layer into a silicon-oxynitride layer. The initial oxide layer is formed by loading a semiconductor substrate into a diffusion furnace at a temperature between 550~750° C., raising the temperature of the substrate to between 700~950° C., and injecting a mixture of oxygen and nitrogen has into the diffusion furnace. The initial oxide layer is then changed into a pure oxide layer by utilizing either a wet or dry oxidation method. The pure oxide layer is then changed into a silicon-oxynitride layer by injecting $N_2O$ into the diffusion furnace. Finally, nitrogen gas is injected into the furnace to cool the substrate down slowly, thereby reduce stress in the substrate One aspect of the present invention is a method for forming a silicon-oxynitride layer on a semiconductor device, the method comprising: (a) forming an initial oxide layer on a semiconductor substrate; (b) changing the initial oxide layer into a pure oxide layer; and (c) changing the pure oxide layer into a silicon-oxynitride layer. Steps (a) through (c) are preferably performed in a vertical diffusion furnace.

Changing the pure oxide layer into a silicon-oxynitride layer can be done by injecting $N_2O$ into the diffusion furnace. And the pure oxide layer can be formed by utilizing either a wet or dry oxidation method. The pure oxide layer grows when the initial oxide layer is changed into a pure oxide layer, and the silicon-oxynitride layer grows when the pure oxide layer is changed into the silicon-oxynitride layer.

Another aspect of the present invention is a method for forming a silicon-oxynitride layer on a semiconductor device, the method comprising: loading a semiconductor substrate into a diffusion furnace at a first temperature; injecting nitrogen into the diffusion furnace; raising the temperature of the diffusion furnace including the semiconductor substrate to a second temperature; injecting a mixture of oxygen and nitrogen gas into the diffusion furnace, thereby forming an initial oxide layer on the semiconductor substrate; oxidizing the semiconductor substrate at the second temperature, thereby changing the initial oxide layer into a pure oxide layer; injecting $N_2O$ gas into the diffusion furnace, thereby changing the pure oxide layer into a silicon-oxynitride layer; and injecting nitrogen gas into the diffusion furnace, thereby reducing the temperature of the diffusion furnace.

A further aspect of the present invention is a semiconductor device comprising a gate insulation layer formed from silicon-oxynitride.

The foregoing and other objects, features and advantages of the invention will become more readily apparent from the following detailed description of a preferred embodiment of the invention which proceeds with reference to the accompanying drawings.

DETAILED DESCRIPTION

Figure 1:
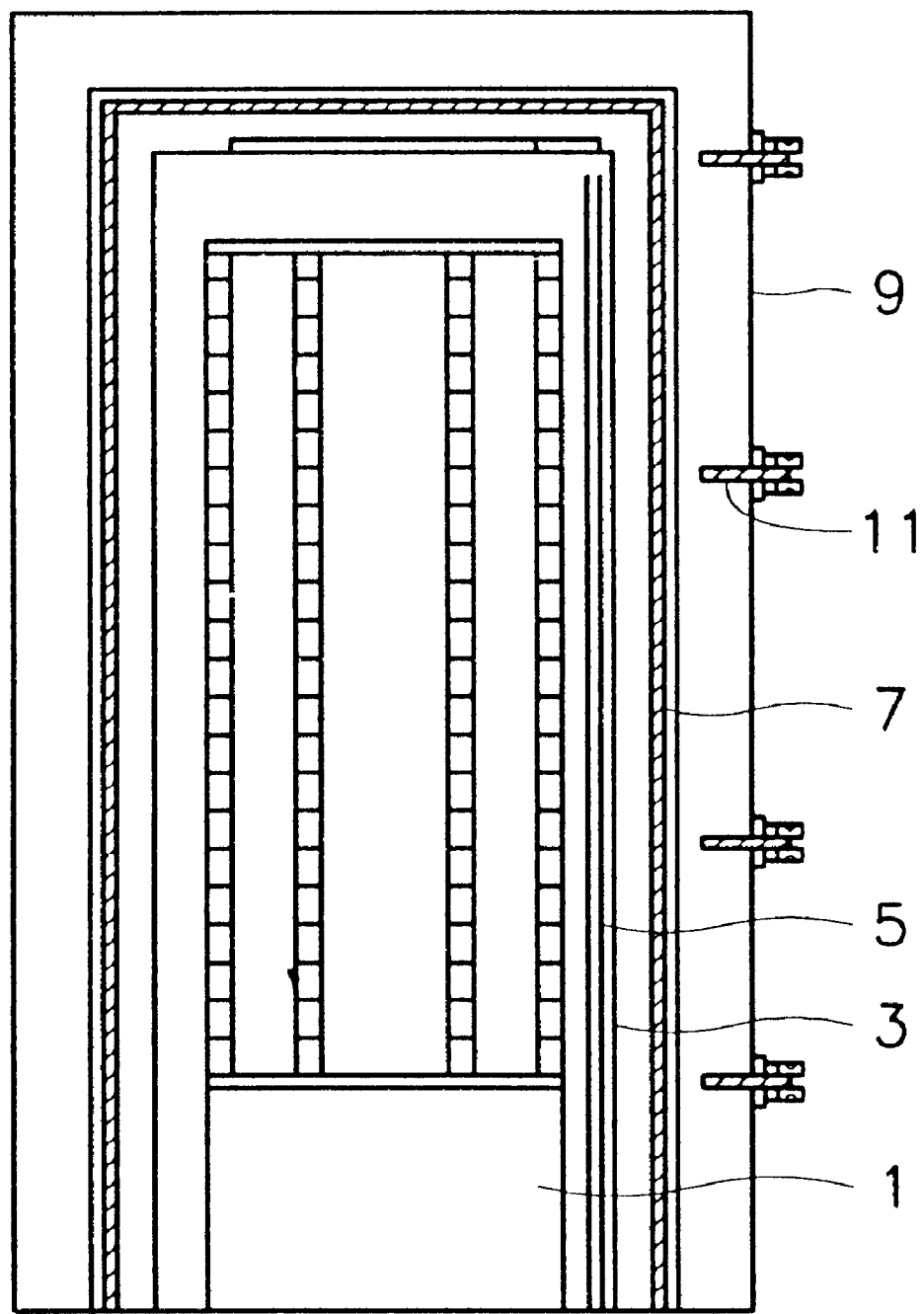
FIG. 1 is a sectional view of an embodiment of a diffusion furnace for forming a silicon-oxynitride layer on a semiconductor device according to the present invention.
Figure 2:
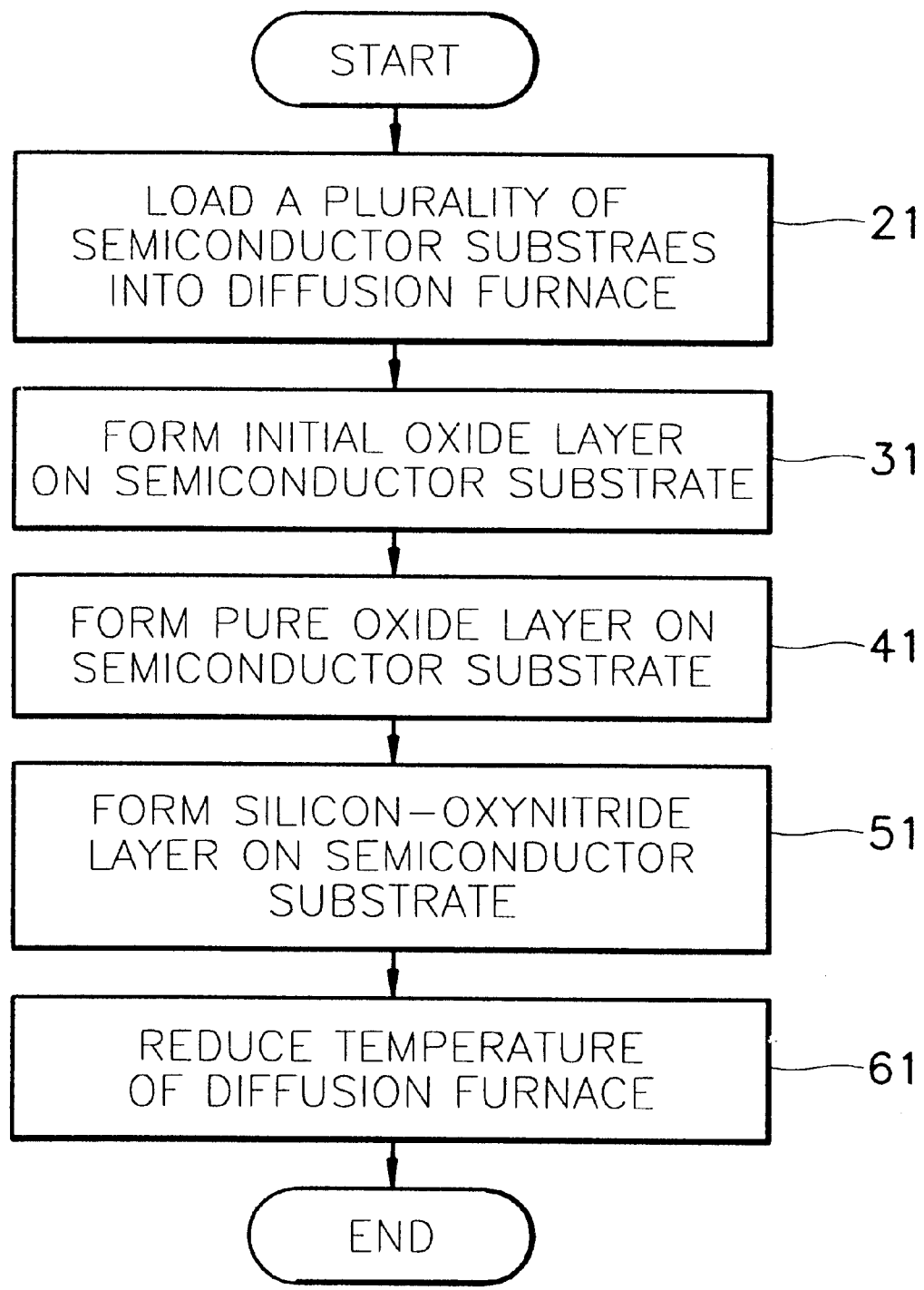
FIG. 2 is a flowchart showing a process for forming a silicon-oxynitride layer on a semiconductor device according to the present invention using the diffusion furnace of FIG. 1.
Figure 3:
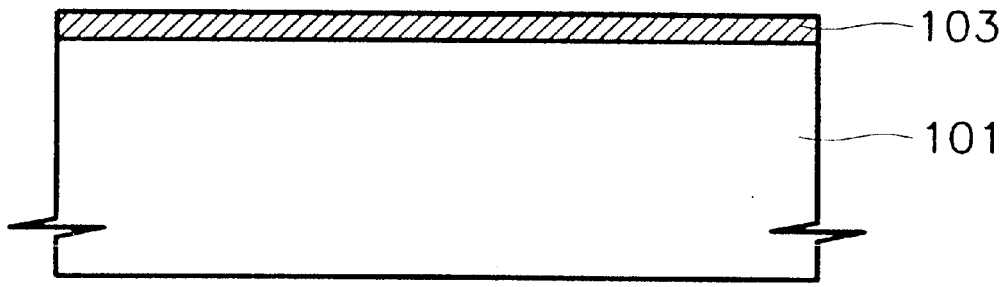
FIGS. 3 through 5 are sectional views showing a process for forming a silicon-oxynitride layer on a semiconductor substrate according to the present invention using the diffusion furnace of FIG. 1.
Figure 4:
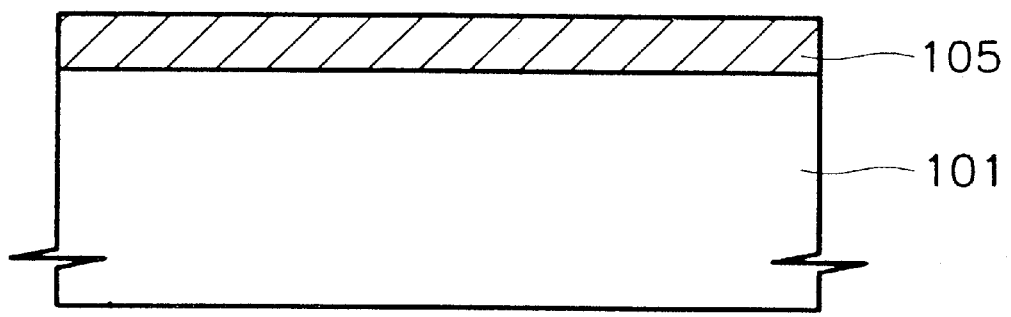
Figure 5:
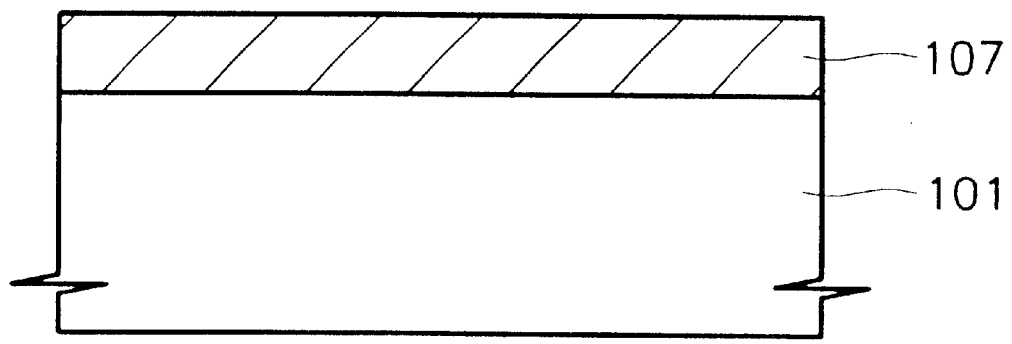

FIG. 1 is a sectional view of an embodiment of a diffusion furnace for forming a silicon-oxynitride layer on a semiconductor device according to the present invention. The diffusion furnace shown in FIG. 1 is a vertical diffusion furnace and includes a boat 1, a tube 3, a gas injection nozzle 5, a cooling jacket 7, an outer surface 9 and a thermocouple 11.

A plurality of semiconductor substrates, i.e., wafers are loaded into the boat 1. The tube 3 surrounds the boat 1 and performs chemical reactions on the semiconductor substrate. The gas injection nozzle 5 is disposed between the boat 1 and the tube 3, and injects gas, for example, oxygen, hydrogen or nitrogen, into the tube 3. The cooling jacket 7 surrounds the tube 3 and maintains the temperature of the tube 3. The outer surface 9 surrounds the cooling jacket 7, and includes a heater for heating the semiconductor substrate. The thermocouple 11 is attached to the outer surface 9 for controlling and reading a temperature of the tube 3. The tube 3 and the cooling jacket 7 are formed from quartz or silicon carbide (SiC).

A process for forming a silicon-oxynitride layer on a semiconductor substrate using the diffusion furnace of FIG. 1 will now be described with reference to FIGS. 2–5. First, 150 or more semiconductor substrates 101 are loaded into the diffusion furnace which is at a first temperature, i.e., 500~750° C., and contains nitrogen that has been injected into the furnace (step 21). Subsequently, the temperature of the diffusion furnace, including the loaded semiconductor substrates 101, is raised to a second temperature, i.e., 700~950° C., and an initial oxide layer 103 is formed on the semiconductor substrates 101 by injecting gas containing a mixture of oxygen and nitrogen (step 31). The temperature of the diffusion furnace is raised by 5~15° C. per minute, and must be controlled to assure a uniform distribution of doping impurities on the semiconductor substrates 101. Also, oxygen is injected during the formation of the initial oxide layer 103 to prevent pitting caused by penetration of nitrogen into the semiconductor substrate 101.

Subsequently, the semiconductor substrates 101 in the diffusion furnace are oxidized to change the initial oxide layer 103 into a pure oxide layer 105 which grows further at the same time (step 41). The pure oxide layer 105 is formed by using either a dry oxidation method for injecting oxygen into the diffusion furnace or a wet oxidation method for injecting a gas mixture containing oxygen and nitrogen. The pure oxide layer 105 is formed before forming a silicon-oxynitride layer. This is because the silicon-oxynitride layer grows very slowly, so it is difficult to form a silicon-oxynitride layer having a thickness of 40 Å at 700~950° C.

Next, $N_2O$ is injected into the diffusion furnace to change the pure oxide layer 105 into a silicon-oxynitride layer 107, which grows further at the same time on the semiconductor substrate 101 (step 51). Since the silicon-oxynitride layer 107 has a combination form of strongly bonded N—O, it can prevent the diffusion of gate electrode impurities into the semiconductor substrate 101, during the subsequent fabricating process.

Then, nitrogen is injected into the diffusion furnace including the silicon-oxynitride layer 107, thereby reducing the temperature of the diffusion furnace by 2~4° C. per minute (step 61). The nitrogen is injected to reduce stress in the semiconductor substrate 101 caused by the reduction in temperature. When the temperature of the diffusion furnace is reduced to the second temperature, the semiconductor substrate is removed from the diffusion furnace.

The silicon-oxynitride layer formed on semiconductor substrate in accordance with the present invention prevents the diffusion of impurities from the doped gate electrode into the semiconductor substrate during subsequent fabricating processes.

Further, the use of a vertical diffusion furnace to form a silicon-oxynitride layer in accordance with the preset invention increase productivity and achieves a uniform nitrogen density in the silicon-oxynitride layer.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for forming a silicon-oxynitride layer on a semiconductor device, the method comprising:

(a) forming an initial oxide layer on a semiconductor substrate;

(b) changing the initial oxide layer into a pure oxide layer; and (c) changing the pure oxide layer into a silicon-oxynitride layer, wherein the silicon-oxynitride layer is formed at about 700~950° C.

2. The method of claim 1 wherein changing the initial oxide layer into a pure oxide layer includes growing the pure oxide layer.

3. The method of claim 1 wherein changing the pure oxide layer into a silicon-oxynitride layer includes growing the silicon-oxynitride layer.

4. The method of claim 1, wherein steps (a) through (c) are performed in a diffusion furnace.

5. The method of claim 4, wherein the diffusion furnace is a vertical diffusion furnace.

6. The method of claim 4, wherein changing the pure oxide layer into a silicon-oxynitride layer includes injecting $N_2O$ into the diffusion furnace.

7. The method of claim 1, wherein forming the pure oxide layer includes utilizing either a wet or dry oxidation method.

8. The method of claim 1, wherein the thickness of the silicon-oxynitride layer is about 40~200 Å.

9. A method for forming a silicon-oxynitride layer on a semiconductor device, the method comprising:

loading a semiconductor substrate into a diffusion furnace at a first temperature;

injecting nitrogen into the diffusion furnace;

raising the temperature of the diffusion furnace including the semiconductor substrate to a second temperature;

injecting a mixture of oxygen and nitrogen gas into the diffusion furnace, thereby forming an initial oxide layer on the semiconductor substrate;

oxidizing the semiconductor substrate at the second temperature, thereby changing the initial oxide layer into a pure oxide layer;

injecting $N_2O$ gas into the diffusion furnace, thereby changing the pure oxide layer into a silicon-oxynitride layer at about 700~950° C.; and injecting nitrogen gas into the diffusion furnace, thereby reducing the temperature of the diffusion furnace.

10. The method of claim 9 wherein oxidizing the semiconductor substrate at the second temperature includes growing the pure oxide layer.

11. The method of claim 9 wherein injecting $N_2O$ gas into the diffusion furnace includes growing the silicon-oxynitride layer.

12. The method of claim 9 wherein the first temperature is about 550~750° C.

13. The method of claim 9 wherein forming the pure oxide layer includes injecting oxygen gas into the diffusion furnace.

14. The method of claim 9 wherein changing the initial oxide layer into a pure oxide layer includes injecting a mixture of oxygen and hydrogen gas into the diffusion furnace.

15. The method of claim 9 wherein the diffusion furnace is a vertical diffusion furnace.

* * * * *